(12) United States Patent
Chen et al.

(10) Patent No.: US 8,003,522 B2
(45) Date of Patent: Aug. 23, 2011

(54) METHOD FOR FORMING TRENCHES WITH WIDE UPPER PORTION AND NARROW LOWER PORTION

(75) Inventors: Hui Chen, South Jordan, UT (US); Ihsiu Ho, Salt Lake City, UT (US); Stacy W. Hall, West Jordan, UT (US); Briant Harward, West Jordan, UT (US); Hossein Paravi, Sandy, UT (US)

(73) Assignee: Fairchild Semiconductor Corporation, San Jose, CA (US)

( * ) Notice: Subject to any disclaimer, the term of this patent is extended or adjusted under 35 U.S.C. 154(b) by 87 days.

(21) Appl. No.: 12/327,425

(22) Filed: Dec. 3, 2008

(65) Prior Publication Data

US 2010/0003823 A1    Jan. 7, 2010

Related U.S. Application Data

(60) Provisional application No. 61/014,871, filed on Dec. 19, 2007.

(51) Int. Cl.
*H01L 21/00* (2006.01)

(52) U.S. Cl. ........ 438/637; 438/646; 438/652; 438/737; 438/782; 257/E21.029; 257/E21.252; 257/E21.257; 257/E21.577; 257/E21.586

(58) Field of Classification Search .......... 438/637–782; 257/E21.029, 252–257, 577–586
See application file for complete search history.

(56) References Cited

U.S. PATENT DOCUMENTS

| | | | | |
|---|---|---|---|---|
| 5,605,600 A | * | 2/1997 | Muller et al. | 438/695 |
| 5,933,759 A | * | 8/1999 | Nguyen et al. | 438/700 |
| 6,066,569 A | | 5/2000 | Tobben | |
| 6,103,456 A | * | 8/2000 | Tobben et al. | 430/317 |
| 6,114,250 A | * | 9/2000 | Ellingboe et al. | 438/709 |
| 6,153,514 A | * | 11/2000 | Wang et al. | 438/640 |
| 6,180,533 B1 | * | 1/2001 | Jain et al. | 438/714 |
| 6,284,149 B1 | * | 9/2001 | Li et al. | 216/64 |
| 6,524,929 B1 | * | 2/2003 | Xiang et al. | 438/424 |
| 6,566,228 B1 | * | 5/2003 | Beintner et al. | 438/430 |
| 6,787,054 B2 | | 9/2004 | Wang et al. | |
| 6,790,770 B2 | * | 9/2004 | Chen et al. | 438/637 |
| 6,913,994 B2 | * | 7/2005 | Guo et al. | 438/638 |
| 6,916,745 B2 | | 7/2005 | Herrick et al. | |

(Continued)

OTHER PUBLICATIONS

PCT International Search Report of the International Searching Authority for Application No. PCT/US2008/86273, Mailed Feb. 2, 2009.

(Continued)

*Primary Examiner* — Michael S Lebentritt
(74) *Attorney, Agent, or Firm* — Kilpatrick Townsend & Stockton LLP

(57) ABSTRACT

A method for forming a semiconductor structure includes the following steps. A hard mask layer is formed over a semiconductor region. The hard mask layer has inner portions that are thinner than its outer portions, and the inner portions define an exposed surface area of the semiconductor region. A portion of the semiconductor region is removed through the exposed surface area of the semiconductor region. The thinner portions of the hard mask layer are removed to expose surface areas of the semiconductor region underlying the thinner portions. An additional portion of the semiconductor region is removed through all exposed surface areas of the semiconductor region thereby forming a trench having an upper portion that is wider than its lower portion.

24 Claims, 9 Drawing Sheets

U.S. PATENT DOCUMENTS

| | | | | |
|---|---|---|---|---|
| 6,949,203 | B2 * | 9/2005 | Hsieh et al. | 216/67 |
| 6,949,460 | B2 * | 9/2005 | Wagganer et al. | 438/637 |
| 6,979,652 | B2 * | 12/2005 | Khan et al. | 438/700 |
| 7,087,484 | B2 * | 8/2006 | Goldbach et al. | 438/243 |
| 7,199,046 | B2 * | 4/2007 | Wetzel et al. | 438/637 |
| 7,344,993 | B2 * | 3/2008 | Balasubramaniam et al. | 438/706 |
| 7,425,486 | B2 * | 9/2008 | Chen et al. | 438/243 |
| 7,442,609 | B2 * | 10/2008 | Wang et al. | 438/272 |
| 7,476,589 | B2 * | 1/2009 | Grebs et al. | 438/270 |
| 7,633,119 | B2 * | 12/2009 | Bhalla et al. | 257/330 |
| 7,700,494 | B2 * | 4/2010 | Balasubramaniam et al. | 438/725 |
| 2005/0167742 | A1 | 8/2005 | Challa et al. | |
| 2006/0273386 | A1 | 12/2006 | Yilmaz et al. | |

OTHER PUBLICATIONS

PCT Written Opinion of the International Searching Authority for Application No. PCT/US2008/86273, Mailed Feb. 2, 2009.

Dalton, T. J. et al., "Interferometric Real-time Measurement of Uniformity for Plasma Etching," J. Electrochem. Soc., vol. 141, pp. 1893-1900, 1994.

Maynard, H. L. et al, "Multiwavelength Ellipsometry for Real-time Process Control of the Plasma Etching of Patterned Samples," J. Vac. Sci. Technol. B, vol. 15, pp. 109-115, 1997.

John, W. et al., "CCD-Controlled in Situ Interferometry for Dry Etch Process Monitoring," Solid State Technology, vol. 44, No. 6, Jun. 2001.

Ramalingam, S. et al., "Photoresist Trimming: Etch Solutions to CD Uniformity and Tuning," Semiconductor International, Aug. 1, 2002.

Yen, Tsung-Fu et al., "Photo-resist Trimming for Sub 0.1 μm Generation Integrated Circuit Devices by CI[2]/O[2] Transform Coupled Plasma," Microelectronic Engineering ISSN 0167-9317, vol. 75, No. 2, pp. 201-209, 2004.

Bliznetsova, V. et al., "Integrated Process of Photoresist Trimming and Dielectric Hard Mask Etching for Sub 50 nm Gate Patterning," Thin Solid Films, vol. 504, Issue 1-2, pp. 117-120, May 10, 2006.

* cited by examiner

METHOD FOR FORMING TRENCHES WITH WIDE UPPER PORTION AND NARROW LOWER PORTION

CROSS-REFERENCES TO RELATED APPLICATIONS

This application claims the benefit of U.S. Provisional Application No. 61/014,871, filed Dec. 19, 2007, which is incorporated herein by reference in its entirety for all purposes.

BACKGROUND OF THE INVENTION

The present invention relates to semiconductor technology and more particularly to a method of forming trenches with a wide upper portion and a narrow lower portion.

Power trench field effect transistors (FETs) such as power trench MOSFETS and IGBTs are well known in the semiconductor industry. One variety of power trench FETs is the vertically-conducting trench FET, a simplified cross-section view of which is shown in FIG. 1. MOSFET 100 has trenches 111 each including a gate electrode 112 insulated from body regions 114 by gate dielectric 110. Source regions 116 flank each trenches 111. Dielectric cap 120 insulates gate electrodes 112 from overlying metal layer 126. Substrate 102 forms the drain of MOSFET 100.

When MOSFET 100 is biased in the on state, current flows vertically between source regions 116 and substrate 102. The current capability of MOSFET 100 in the on state is a function of the drain to source resistance ($Rds_{on}$). To improve the current capability of the MOSFET, it is necessary to reduce the $Rds_{on}$. One way to reduce the $Rds_{on}$ of the trench FET is to increase the trench density (i.e., to increase the number of trenches per unit area). This may be achieved by reducing the cell pitch. However, reducing the cell pitch of trench FETs is limited by the particulars of the FET cell structure and the specific process recipe used to manufacture the FET. Reducing the cell pitch is made further difficult by such limitations of the manufacturing process technology as the minimum critical dimensions the photolithography tools are configured to resolve, the minimum required spacing between different cell regions as dictated by the design rules and the misalignment tolerances.

The different dimensions that determine the minimum cell pitch for trench MOSFET 100 are shown in FIG. 1. Dimension A is the minimum trench width the photolithography tools are configured to resolve, dimension B is the minimum contact opening the photolithography tools are configured to resolve, dimension C is the minimum trench-to-contact spacing dictated by the design rules, and dimension D is the contact registration error tolerance or contact misalignment tolerance. The minimum cell pitch for MOSFET 100 thus equals A+B+2C+2D. Cost effective techniques for reducing the cell pitch are disclosed in U.S. Pat. No. 6,916,745 issued Jul. 12, 2005 to Herrick et al., incorporated herein in its entirety. One aspect of the techniques disclosed in U.S. Pat. No. 6,916,745 is formation of trenches with a wide upper portion and a narrow lower portion. Described hereinafter, in accordance with embodiments of the present invention, are even more cost effective techniques for forming such trenches.

BRIEF SUMMARY OF THE INVENTION

In accordance with an embodiment of the invention, a method for forming a semiconductor structure includes the following steps. A hard mask layer is formed over a semiconductor region. The hard mask layer has inner portions that are thinner than its outer portions, and the inner portions define an exposed surface area of the semiconductor region. A portion of the semiconductor region is removed through the exposed surface area of the semiconductor region. The thinner portions of the hard mask layer are removed to expose surface areas of the semiconductor region underlying the thinner portions. An additional portion of the semiconductor region is removed through all exposed surface areas of the semiconductor region thereby forming a trench having an upper portion that is wider than its lower portion.

In one embodiment, the step of forming a hard mask layer includes forming a stack of a hard mask layer and a photoresist layer over a semiconductor region such that the photoresist layer has an opening therein and the hard mask layer has outer portions covered by the photoresist layer and inner portions exposed through the opening in the photoresist layer. The exposed inner portions are thinner than the covered outer portions of the hard mask layer, and the exposed inner portions define an exposed surface area of the semiconductor region.

In another embodiment, the step of forming a stack of a hard mask layer and a photoresist layer includes the following steps. A hard mask layer is formed over a semiconductor region. A patterned photoresist layer is formed over the hard mask layer, and has an opening through which a surface area of the hard mask layer is exposed. A recess is formed in the hard mask layer through the exposed surface area of the hard mask layer. The patterned photoresist layer is trimmed so as to widen the opening in the patterned photoresist layer thereby exposing additional portions of the hard mask layer. Exposed portions of the hard mask layer are recessed to form exposed inner portions of the hard mask layer which define an opening through which a surface area of the semiconductor region is exposed.

In accordance with another embodiment of the invention, a method for forming a semiconductor structure includes the following steps. A hard mask layer is formed over a semiconductor region. The hard mask layer has inner portions that are thinner than its outer portions, and the inner portions define an exposed surface area of the semiconductor region. A single etch process is used to remove: (1) a portion of the semiconductor region through the exposed surface area of the semiconductor region, (2) the thinner portions of the hard mask layer, and (3) portions of the semiconductor region underlying the thinner portions, thereby forming a trench having an upper portion that is wider than its lower portion.

In one embodiment, the single etch process thins down but does not completely remove the outer portions of the hard mask layer.

In another embodiment, the single etch process is carried out using a selective etch process.

In yet another embodiment, the single etch process is carried out using an etch process with an etch selectivity of the semiconductor region to the hard mask layer of about 10 or more.

In still another embodiment, the step of forming a hard mask layer includes forming a stack of a hard mask layer and a photoresist layer over a semiconductor region such that the photoresist layer has an opening therein and the hard mask layer has outer portions covered by the photoresist layer and inner portions exposed through the opening in the photoresist layer. The exposed inner portions are thinner than the covered outer portions of the hard mask layer, and the exposed inner portions define an exposed surface area of the semiconductor region.

The following detailed description and the accompanying drawings provide a better understanding of the nature and advantages of the present invention.

DETAILED DESCRIPTION OF THE INVENTION

In accordance with embodiments of the invention, a method for forming a trench with a wide upper portion and a narrow lower portion is disclosed which can be advantageously integrated with the process for forming power trench gate FETs such as trench gate MOSFETs and trench gate IGBTs, their shielded gate variations and/or superjunction variations. The techniques for forming trenches in accordance with the invention provide precise CD and trench depth control and substantial manufacturing cost savings as described more fully further below.

Figure 2A:
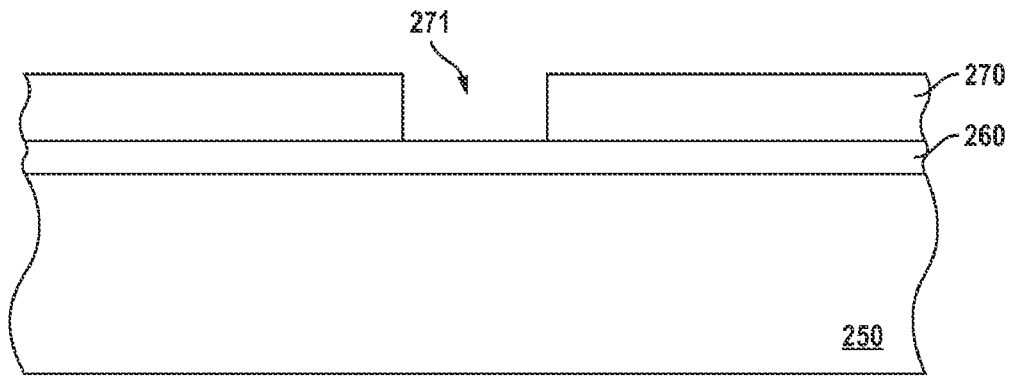
FIGS. 2A-2H are schematic cross-section views showing a method for forming a trench with a wider upper portion and a narrower lower portion in accordance with an exemplary embodiment of the invention.

FIGS. 2A-2H are simplified cross-section views showing a method for forming such a trench within a semiconductor region in accordance with an embodiment of the invention. In FIG. 2A, hard mask layer 260 is formed over semiconductor region 250. A patterned photoresist layer 270 is formed over hard mask layer 260. Semiconductor region 250 can be a silicon substrate, a III-V compound substrate, a silicon/germanium (SiGe) substrate, an epi-substrate, a silicon-on-insulator (SOI) substrate, a display substrate such as a liquid crystal display (LCD), a plasma display, an electro luminescence (EL) lamp display, or a light emitting diode (LED) substrate, for example. In some embodiments, semiconductor region 250 includes an epi layer (not shown) formed over a silicon substrate. The epi layer may be a crystal silicon layer, a doped silicon layer or other material layer that may be adapted to be formed over a silicon substrate.

Hard mask layer 260 may be a layer having a material different from that of semiconductor region 250. In one embodiment where semiconductor region 250 comprises silicon, hard mask layer 260 is of a material that is highly selective to silicon. In some embodiments, hard mask layer 260 may be a dielectric layer, such as a thermally grown oxide layer, a nitride layer, an oxynitride layer, other dielectric layer or various combinations thereof. Hard mask layer 260 may be formed by, for example, a chemical vapor deposition (CVD) process, an ultra high vacuum chemical vapor deposition (UHVCVD) process, an atomic layer chemical vapor deposition (ALCVD) process, a metal organic chemical vapor deposition (MOCVD) process or other CVD process. The patterned photoresist layer 270 may include many openings similar to opening 271 where trenches are to be formed. The patterned photoresist layer 270 may be formed by, for example, a conventional photolithographic process.

Figure 2B:
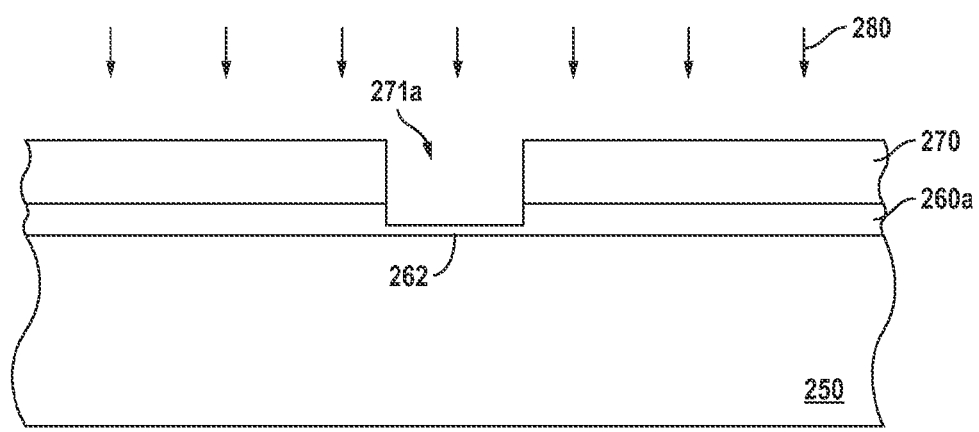

In FIG. 2B, etch step 280 is carried out to form recess 271a in hard mask layer 260 using the patterned photoresist layer 270 as an etch mask. Etch step 280 is carefully engineered to obtain the desired recess depth without exposing substrate 250. In some embodiments, the known interferometer endpoint technique is used for end point detection in order to provide precise control over the etch depth. In other embodiments, a carefully controlled timed etch may be used to form recess 271a in hard mask layer 260. The depth of recess 271a can be determined from the target trench depth and the silicon trench etch selectivity. This is more fully described further below.

In some embodiments, etch step 280 may include a dry etch step. Where etch step 280 includes a dry etch step and hard mask 260 comprises oxide, the oxide etch chemistry includes a precursor which in turn includes at least one fluorine-containing gas, such as carbon tetrafluoride ($CF_4$), trifluoromethane ($CHF_3$), hexafluoroethane ($C_2F_6$), cyclobutane ($C_4F_8$), difluoromethane ($CH_2F_2$) or other fluorine-containing gas may be used. In some embodiments, at least one additive gas, such as argon, nitrogen, oxygen, carbon monoxide or other additive is used in etch step 280.

Figure 2C:
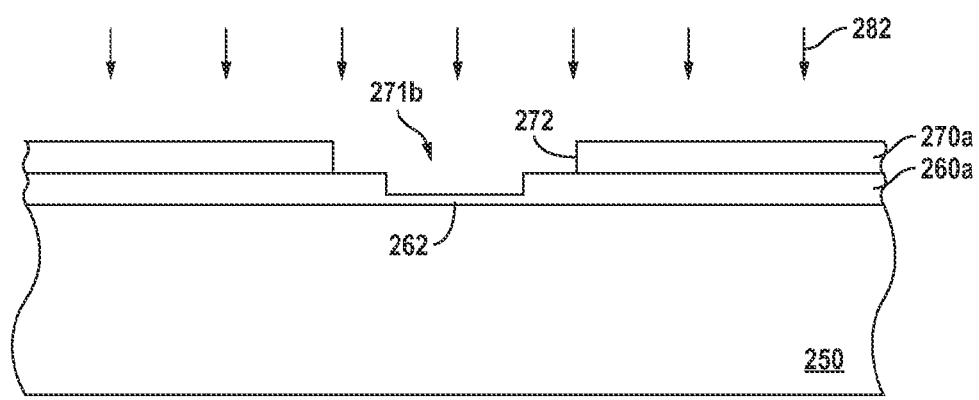

In FIG. 2C, another etch step 282 is carried out to trim the patterned photoresist layer 270 so as to pull back edges 272 of the patterned photoresist layer 270 to thereby expose additional surface areas of hard mask 260a. Precise trimming of the photoresist is needed given that the opening in the trimmed photoresist plays an important role in obtaining the desired shape and CD of the final trench. In some embodiments, etch step 282 may be carried out in accordance with one or more of a number of known photoresist trimming techniques such as that disclosed in the publication titled "Photoresist Trimming: Etch Solutions to CD Uniformity and Tuning" authored by Shyam Ramalingam et al., Semiconductor International, September 2002, which is incorporated herein by reference in its entity.

Etch step 282 may reduce the height of the patterned photoresist layer 270. Etch step 282 trims the patterned photoresist layer 270 with minimal to no impact on recessed hard mask layer 260a. As can be seen, etch step 282 is carried out without using a photolithographic process. In some embodiments, etch step 282 may include a dry etch step and/or a wet etch step. Where etch step 282 includes a dry etch step, a precursor including at least one oxygen-containing gas, such as an oxygen gas ($O_2$), an ozone gas ($O_3$) or other oxygen-containing gas that is suitable for trimming photoresist is used. In some embodiments, etch step 240 may include at least one additive gas, such as chlorine ($Cl_2$), argon (Ar), hydrogen bromide (HBr) or other additive that is suitable for trimming photoresist.

Figure 2D:
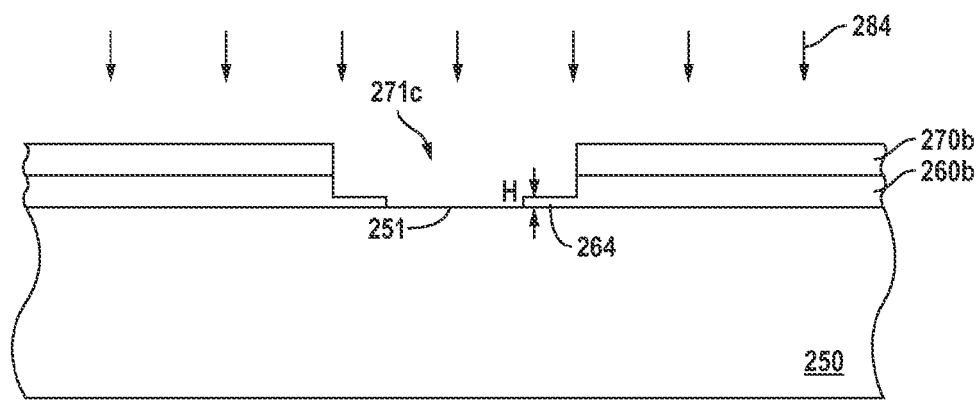

In FIG. 2D, a further etch step 284 is carried out to remove a portion of recessed hard mask layer 260a using the trimmed photoresist layer 270b as an etch mask. This etch step is also carefully engineered to ensure that a surface area 251 of semiconductor region 250 is fully exposed while step portions 264 of hard mask layer 260b with a predesignated step height "H" are formed. In one embodiment, the known interferometer endpoint technique is used for end point detection in order to provide precise control over height H while ensuring that no hard mask residue remains in surface area 251. In other embodiments, a carefully controlled timed etch may be used to obtain the target height H.

In some embodiments, etch step 284 may include a dry etch step. In the case where etch step 284 includes a dry etch step, a precursor including at least one fluorine-containing gas, such as carbon tetrafluoride ($CF_4$), trifluoromethane ($CHF_3$), hexafluoroethane ($C_2F_6$), cyclobutane ($C_4F_8$), Difluoromethane ($CH_2F_2$) or other fluorine-containing gas may be used. In some embodiments, at least one additive gas, such as argon, nitrogen, oxygen, carbon monoxide or other additive may be used in etch step 284.

In some embodiments using 0.35-μm trench-pitch technology or 1.4-μm cell-pitch technology for forming power metal-oxide-semiconductor field effect transistors (MOSFETs), the thickness "H" may be between about 1,000 Å and 1,400 Å. The invention is not limited to this numerical range. Other values for H may be selected depending on the process technology and the target trench dimensions. Also, as can be seen, etch step 284 is carried out without using a photolithographic process.

Figure 2E:
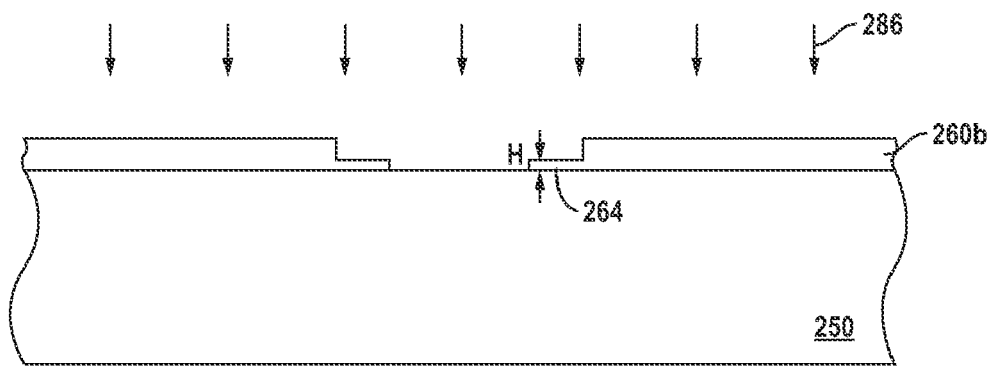

In FIG. 2E, a removing step 286 substantially strips photoresist layer 270b. Removing step 286 may include, for example, a dry etch step and/or a wet etch step. In the case where removing step 286 includes a dry etch step, a precursor including at least one oxygen-containing gas, such as an oxygen gas ($O_2$), an ozone gas ($O_3$), or other oxygen-containing gas that is suitable to remove photoresist may be used. In some embodiments, removing step 286 may use at least one additive gas, such as chlorine ($Cl_2$), argon (Ar), hydrogen bromide (HBr) or other additive that is suitable for removing photoresist. In one embodiment, photoresist layer 270b is in situ stripped after etch step 284 in FIG. 2D.

Figure 2F:
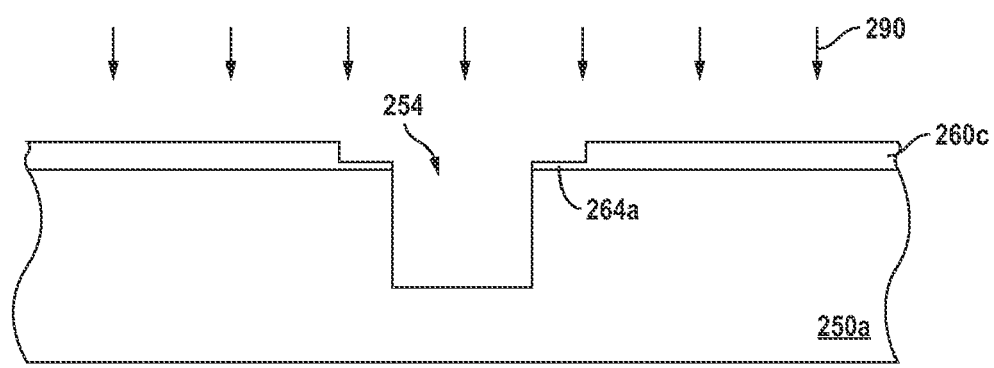

In FIG. 2F, etch step 290 recesses semiconductor region 250 using hard mask layer 260b as an etch mask so as to form recess 254 within semiconductor region 250. In one embodiment where semiconductor region 250 comprises silicon, a conventional silicon etch process is used to form trench 254. Etch step 290 may include a dry etch step and/or a wet etch step. In some embodiments, etch step 290 may use a precursor including at least one of $Cl_2$, Ar, helium (He), HBr, $O_2$, nitrogen trifluoride ($NF_3$) and sulfur hexafluoride ($SF_6$).

Some of hard mask layer 260b may be removed during etch step 290. However, height H of step portion 264 of hard mask 260b is selected so that a sufficient amount 264a of step portion 264 remains after etch process 290 to ensure that portions of semiconductor region 250a extending under step portions 264 are not removed during etch step 290. In some embodiments, etch step 290 has an etch selectivity of semiconductor region 250 to hard mask layer 260b of about 10 or more, such that etch step 290 may desirably etch semiconductor region 250 without removing a substantial portion of hard mask layer 260b. In some embodiments, known interferometer depth control techniques may be used to precisely control the depth of recess 254. As can be seen, etch step 290 is carried out without using a photolithographic process.

Figure 2G:
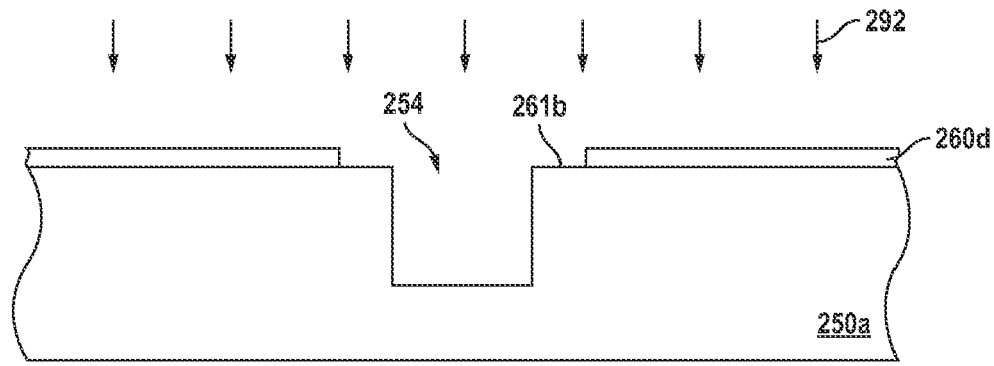

In FIG. 2G, etch step 292 substantially removes step portions 264a of hard mask layer 260c so as to expose surface regions 261b of semiconductor region 250a. In some embodiments, etch step 292 may include a dry etch step and/or a wet etch step. In the case where etch step 292 includes a dry etch step, a precursor including at least one fluorine-containing gas, such as carbon tetrafluoride ($CF_4$), trifluoromethane ($CHF_3$), hexafluoroethane ($C_2F_6$), cyclobutane ($C_4F_8$), difluoromethane ($CH_2F_2$) or other fluorine-containing gas may be used. In some embodiments, etch step 292 may use at least one additive gas, such as argon, nitrogen, oxygen, carbon monoxide or other additive that is adequate to be added in etch step 292 to remove step portions 264a of hard mask layer 260c. In some embodiments, etch step 292 is designed to have a relatively high etch selectivity of hard mask layer 260b to substrate 250a to ensure that step portions 264a of hard mask layer 260b are completely removed while any etching of substrate 250a is minimized.

Figure 2H:
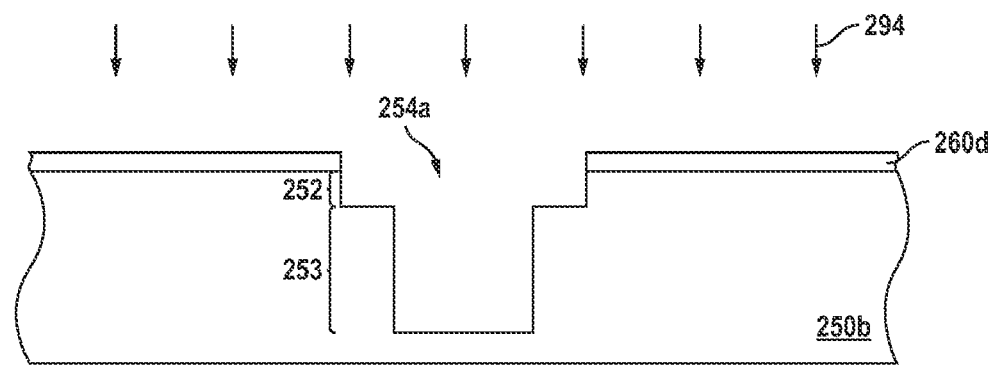

In FIG. 2H, etch step 294 removes a portion of substrate 250a using hard mask layer 260d as an etch mask so as to form trench 254a in substrate 250a. Trench 254a thus has an upper portion 252 that is wider than a lower portion 253. Etch step 294 may include a dry etch step and/or a wet etch step. In some embodiments, etch step 294 may use a precursor including at least one of $Cl_2$, Ar, helium (He), HBr, $O_2$, nitrogen trifluoride ($NF_3$) and sulfur hexafluoride ($SF_6$). In some embodiments, known interferometer depth control techniques may be used to precisely control the depth of trench 254a.

Figure 3A:
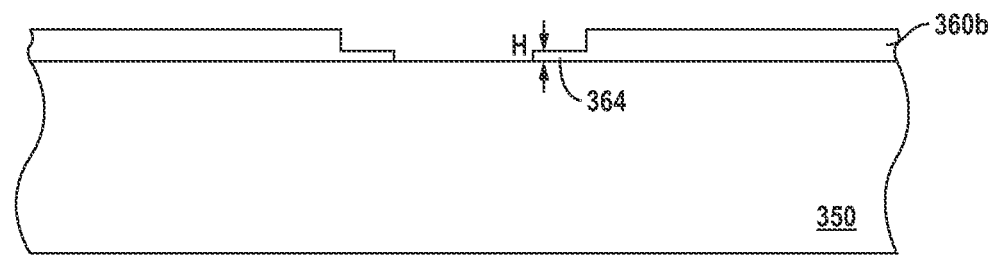
FIGS. 3A-3B are simplified cross-section views illustrating an alternate process for forming a trench with a wider upper portion and a narrower lower portion in accordance with another embodiment of the invention.
Figure 3B:
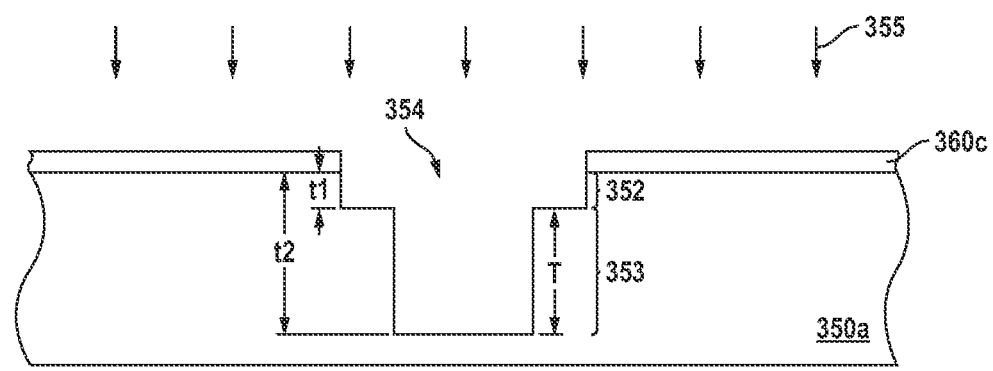

In an alternate embodiment, the three etch steps depicted in FIGS. 2F-2H may be replaced with a single etch step as depicted in FIGS. 3A-3B. The cross section view in FIG. 3A corresponds to the cross section view in FIG. 2F and thus the process steps leading to FIG. 3A correspond to those depicted in FIGS. 2A-2F. In FIG. 3B, etch step 355 is carried out to remove step portions 364 of hard mask layer 360b as well as portions of semiconductor region 250 resulting in formation of final trench 354 with shallower but wider upper portion 352 and deeper and narrower lower portion 353. Depending on the target trench depth t2, the target depth t1 of the shallower portion of the trench, and height H of step portions 364 of hard mask layer 360b, etch step 355 may be designed to have an appropriate selectivity between hard mask layer 360b and semiconductor region 250 per equation (1) below.

$$T = t2 - t1 = S \times H \quad (1)$$

In equation (1), "T" represents the difference between the full depth t1 of the trench and the depth of upper portion 352 of the trench; "S" represents the selectivity; and "H" represents the height of step portion 364 of hard mask layer 360b in FIG. 2E. In one exemplary embodiment, in a 0.35 μm process technology, for H1=1,000 Å, to obtain t2=1.5 μm and t1=0.5 μm, the selectivity S may be set to a value in the range of 7-10.

Referring back to FIGS. 2A-2H, in accordance with an embodiment of the invention, all etch steps prior to the first silicon etch 290 are performed in-situ in a single etch chamber. That is, the etch steps for etching the hard mask (etch steps 280 and 284) as well as the photoresist etch steps (the initial resist etch for defining trench opening 271 in FIG. 2A, the later resist trimming step 282 in FIG. 2C, and the resist removal step 286 in FIG. 2E) may all be carried out in a single etch chamber such as a plasma etch chamber. By performing a number of the etch steps in a single chamber, the wafer movements and thus the cycle time is substantially reduced. This, in combination with interferometer end point measurement techniques and the resist trimming techniques, provides precise CD and trench depth control and substantial manufacturing cost savings. In an alternate embodiment, the various etch steps for etching the hard mask may be carried out in one etch chamber, and the various etch steps for etching the photoresist layer may be carried out in a different etch chamber.

Figure 4A:
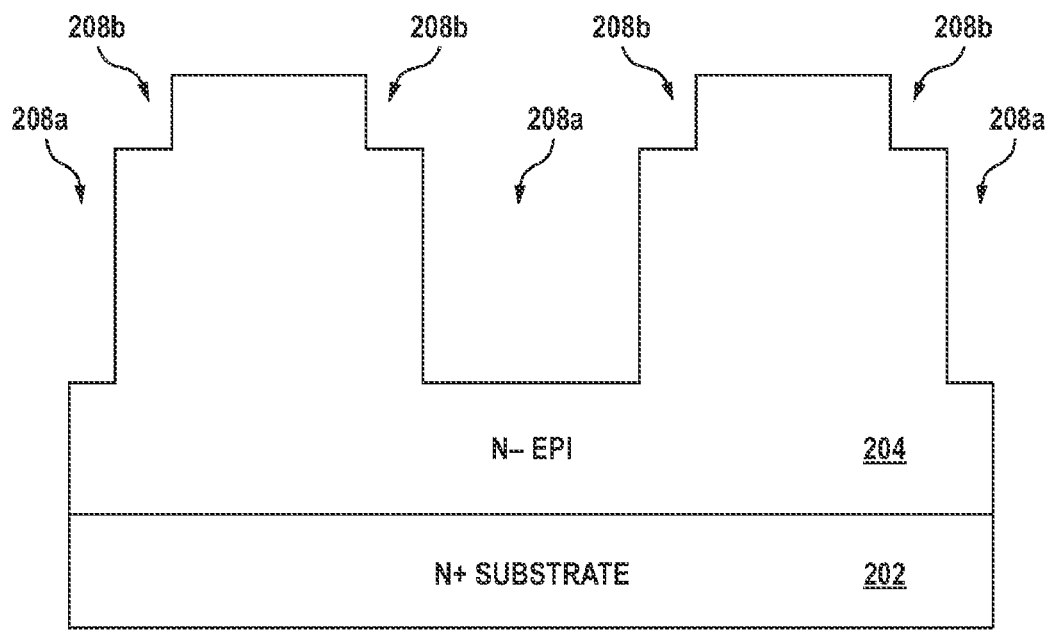
FIGS. 4A-4H are simplified cross-section views showing an exemplary method for forming a trench MOSFET where the trenches are formed in accordance with the processes depicted in FIGS. 2A-2H or FIGS. 3A-3B.

The above described techniques for forming trenches with a wider upper portion and a narrower lower portion, may be advantageously incorporated in processes for forming various types of trench semiconductor devices. FIGS. 4A-4H are simplified cross-section views showing an exemplary method for forming a trench gate MOSFET where the trenches are formed in accordance with the processes depicted in FIGS. 2A-2H or FIGS. 3A-3B. In FIG. 4A, the trenches with wider upper portion 208b and narrower lower portion 208a are formed in N-type epitaxial layer 204 using the process depicted in FIGS. 2A-2H or its variation depicted by FIGS. 3A-3B. Epitaxial layer 204 extends over N-type substrate 202.

Figure 4B:
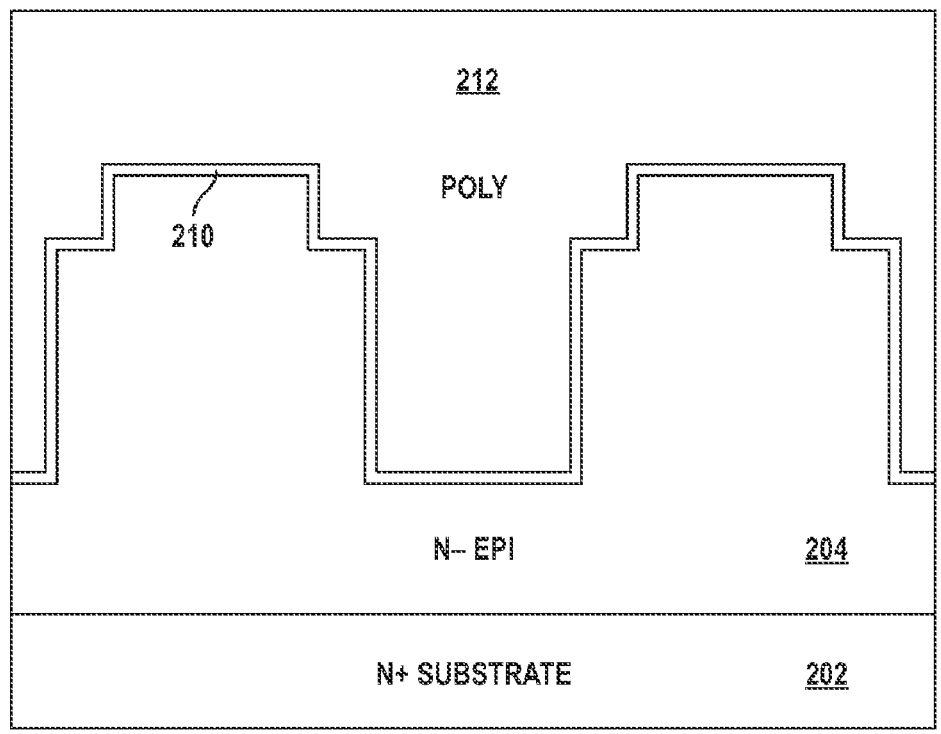

In FIG. 4B, an insulating layer 210 is formed along the surface of epitaxial layer 204 using conventional methods. Sidewalls of the trenches are thus coated with insulating layer 210. Insulating layer 210 has a thickness in the range of 50-1,000 Å. In one embodiment, insulating layer 210 is a gate oxide having a thickness of about 400 Å. Next, using conventional polysilicon deposition techniques, a polysilicon layer 212 having a thickness in the range of 1,000-15,000 Å is deposited over insulating layer 210 to fill the trenches. In one embodiment, polysilicon layer 212 has a thickness of about 5,500 Å and is doped with impurities. In yet another embodiment, prior to forming polysilicon layer 212, a thick insulating layer is formed along the bottom of the mid-section 208a of the trenches. This advantageously reduces the gate capacitance of the MOSFET.

Figure 4C:
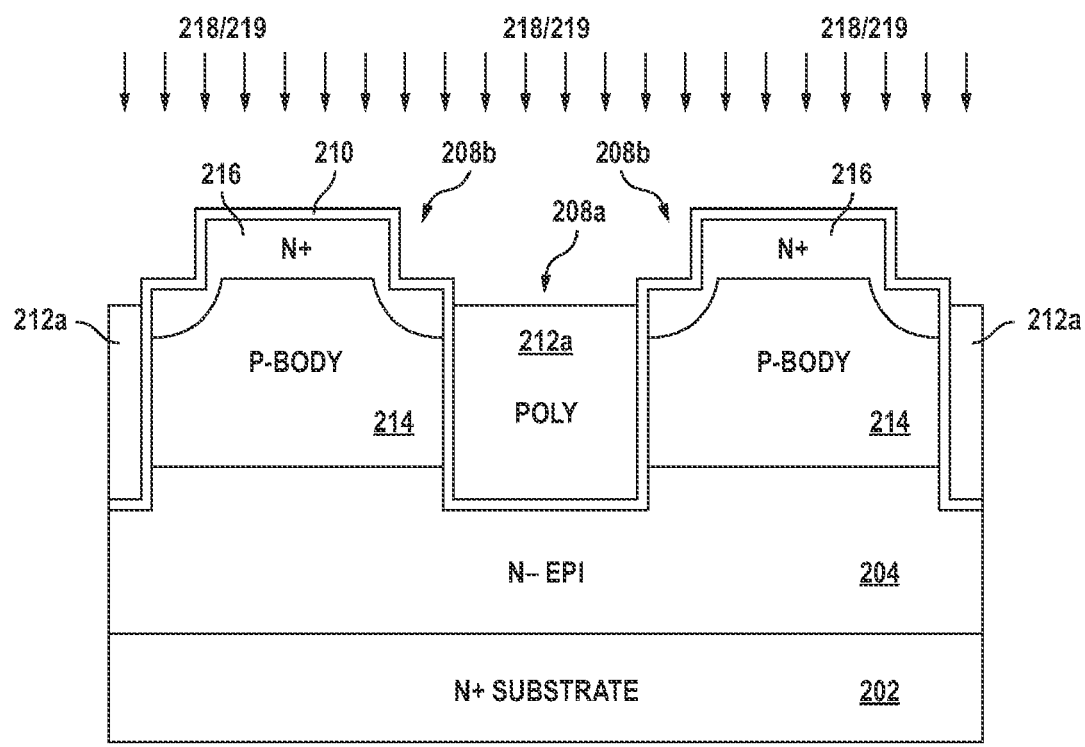

In FIG. 4C, polysilicon layer 212 is etched back to form gates 212a in mid-section 208a of the trenches. Polysilicon layer 212 is etched back such that its upper surface is recessed below the outer sections 208b of the trenches. This insures that no polysilicon is left in the outer sections 208b of the trenches which may otherwise short the gate to the source and also block the source and body implants carried out later in the process. However, the extent to which the polysilicon layer 212 is etched back must be carefully controlled to insure that at least a portion of the gate overlaps with the source regions formed in later steps. Conventional polysilicon etching techniques may be used to etch back polysilicon layer 212.

P-type body regions 214 are then formed in epitaxial layer 204 between adjacent trenches by implanting P-type impurities such as boron. The P-type implant is symbolically shown by arrows 218 which indicate that no mask is needed. Body regions 214 extend into epitaxial layer 204 to a depth primarily dictated by the target channel length. Next, highly-doped N-type regions 216 are formed in body regions 214 by implanting N-type impurities such as arsenic or phosphorous. N-type regions 216 extend along the top surface of body regions 214 and directly below outer sections 208b of the trenches. The N-type implant is symbolically shown by arrows 219 which indicate that no masking is needed for this implant either. Conventional ion implantation techniques may be used for both implant steps.

Figure 4D:
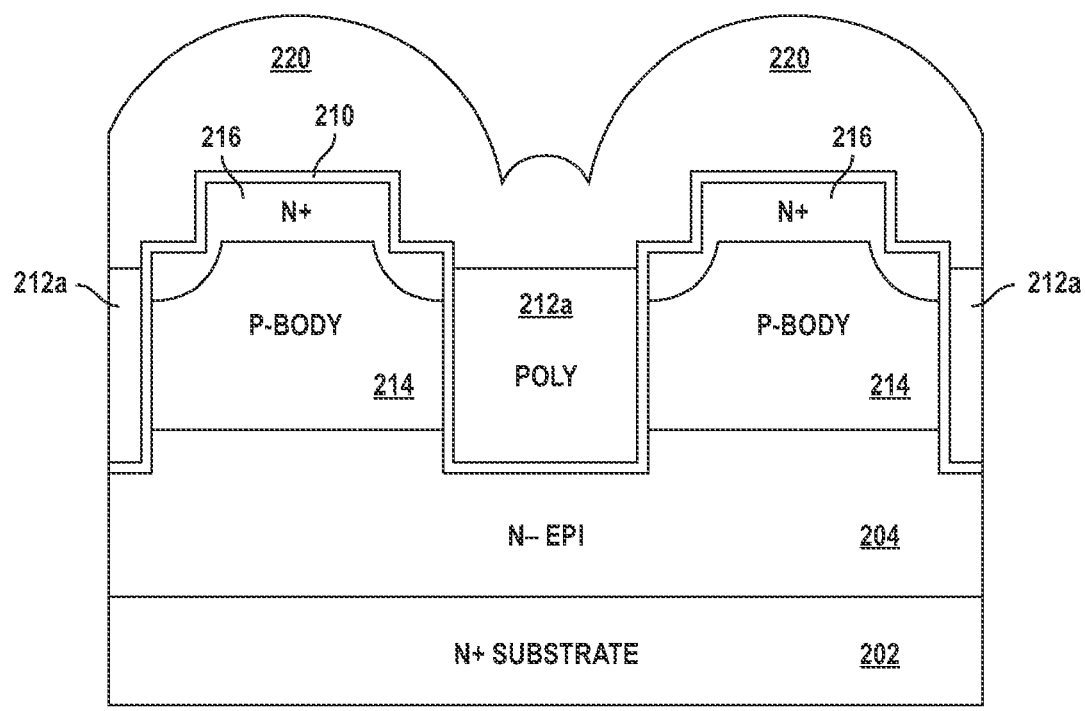
Figure 4E:
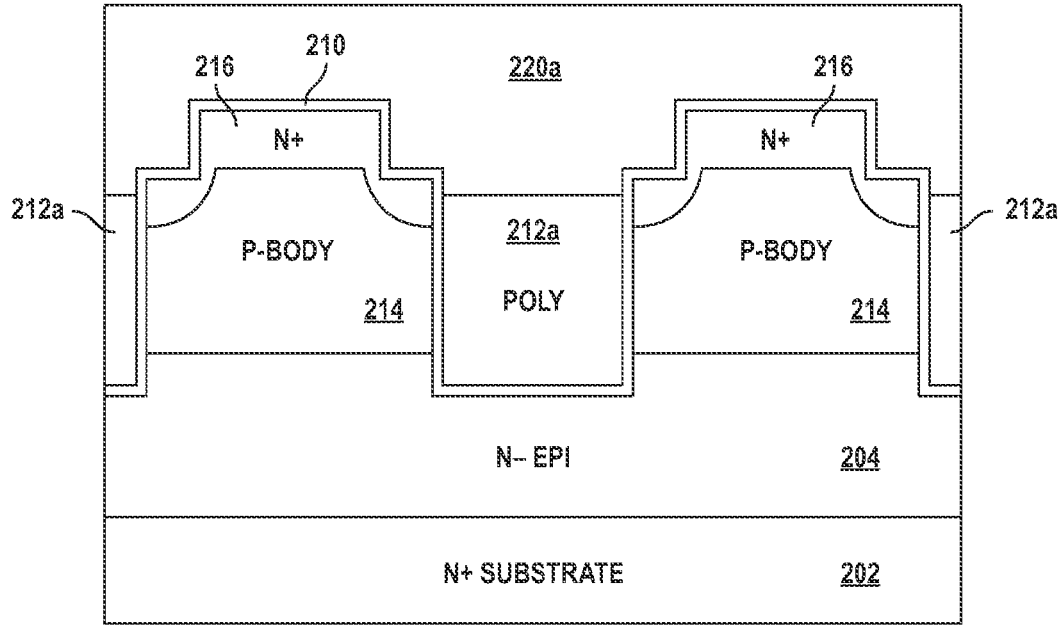
Figure 4F:
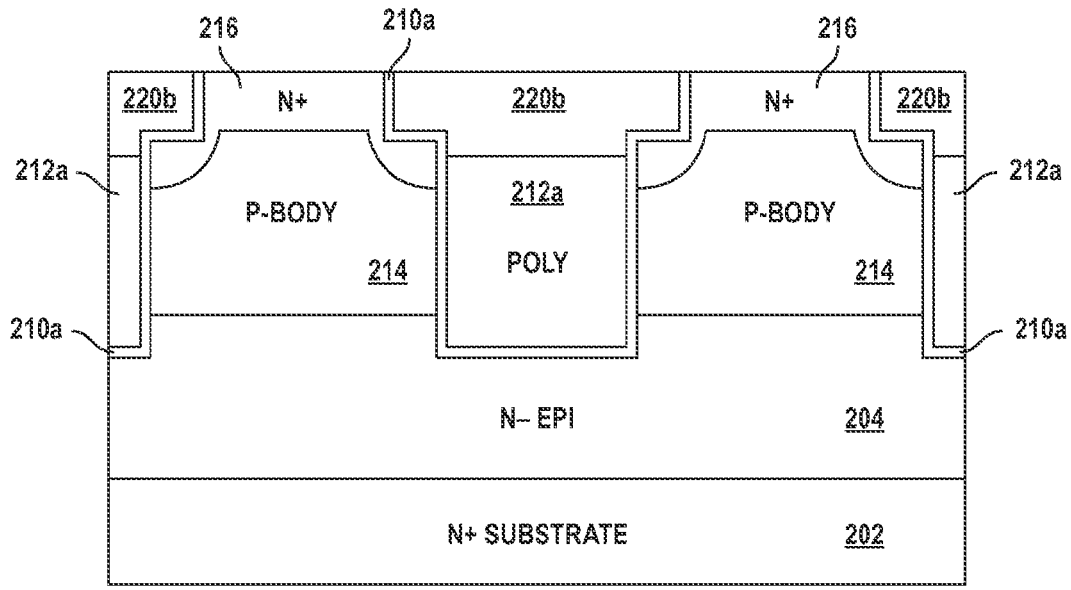

In FIG. 4D, a dielectric layer 220, such as BPSG, is formed over the entire structure using conventional techniques. Dielectric layer 220 has a thickness in the range of 2,000-15,000 Å. In one embodiment, the thickness of dielectric layer 220 is about 8,000 Å. Next, a conventional dielectric flow step is carried out to obtain a planar surface as shown in FIG. 4E. Dielectric layer 220a is then etched until silicon is reached as shown in FIG. 4F. After the dielectric etch, dielectric regions 220b which are fully contained in the trenches remain while surface areas of N-type regions 216 are exposed.

Figure 4G:
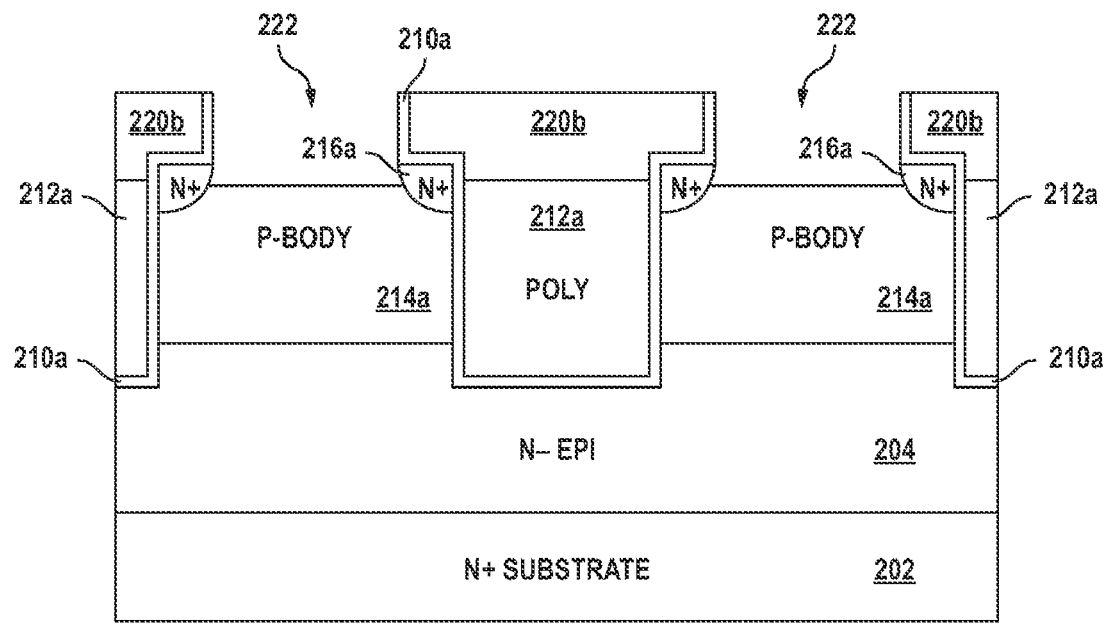

In FIG. 4G, a conventional silicon etch is carried out to form contact openings 222. Sufficient amount of silicon is removed so that along with the upper portion of N-type regions 216 a top layer of body regions 214 is also removed. This insures that: (i) a top surface of body regions 214a becomes exposed so that contact can be made to body regions 214a, (ii) of N-type region 216, source regions 216a separated by body regions 214a remain, and (iii) sidewall areas of source regions 216a become exposed so that contact can be made to source regions 216a.

Figure 4H:
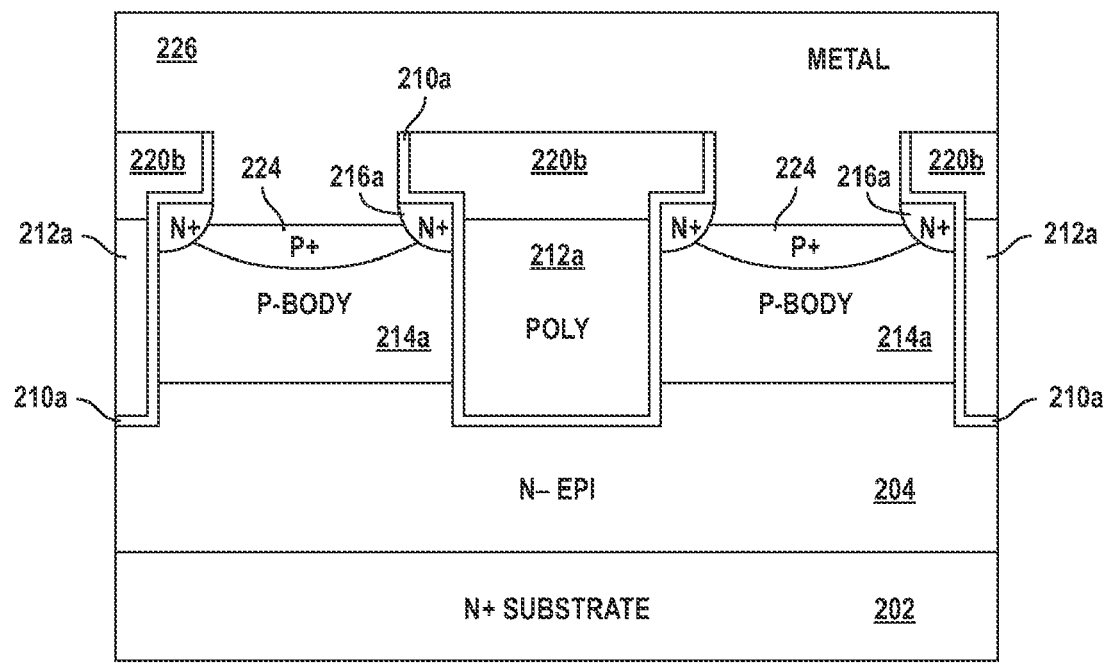

In FIG. 4H, metal layer 226 is deposited to contact body regions 214a and source regions 216a. Before metal 226 is deposited, a layer of heavily doped P-type region 224 may optionally be formed along the top surface of body regions 214a using conventional ion implantation techniques. The heavily doped region 224 helps achieve an ohmic contact between metal 226 and body region 214a. As shown, metal layer 224 is insulated from gates 212a by the dielectric layer 220b extending along the top surface of each trench.

Referring back to FIG. 4G, the silicon etch carried out to form contact openings 222 exposes portions of insulating layer 210 extending along the sidewalls of outer sections 208b of the trenches. As can be seen, the exposed portions of insulating layer 210 together with the exposed sidewall area of source regions 216a advantageously define contact openings 222 between adjacent trenches. Thus, with no masking steps used in forming either source regions 216a or contact openings 222, source regions 216a and contact openings 222 which are self-aligned to the trenches are formed.

Figure 1:
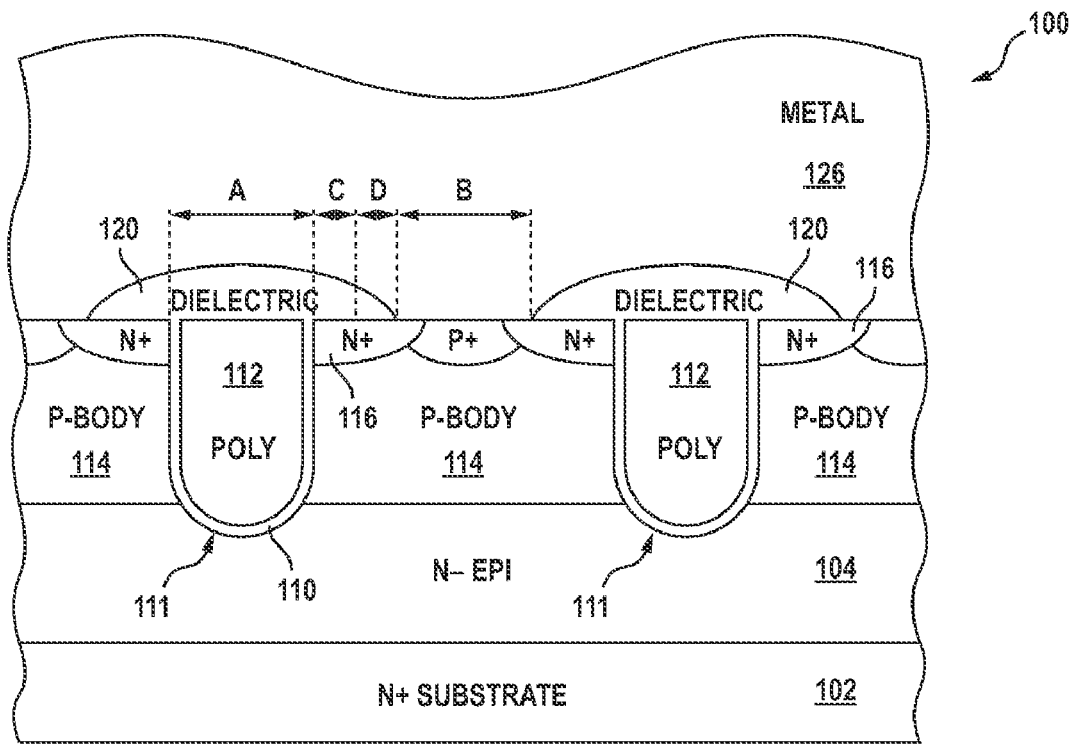
FIG. 1 is a simplified cross-section view of a conventional trench MOSFET.

Because source regions 216a and contact openings 222 are self-aligned to the trenches, the need to account for contact misalignment as in conventional techniques (dimension D in FIG. 1) is eliminated. Furthermore, the contact openings (dimension B in FIG. 1) can be made smaller than the photolithography tools are typically configured to resolve. Thus, not only the 2D term is eliminated from the minimum cell pitch A+B+2C+2D of the conventional trench MOSFET in FIG. 1, but the term B can be made much smaller. For the same process technology, a much smaller cell pitch is therefore obtained without increasing the process complexity.

Figure 5:
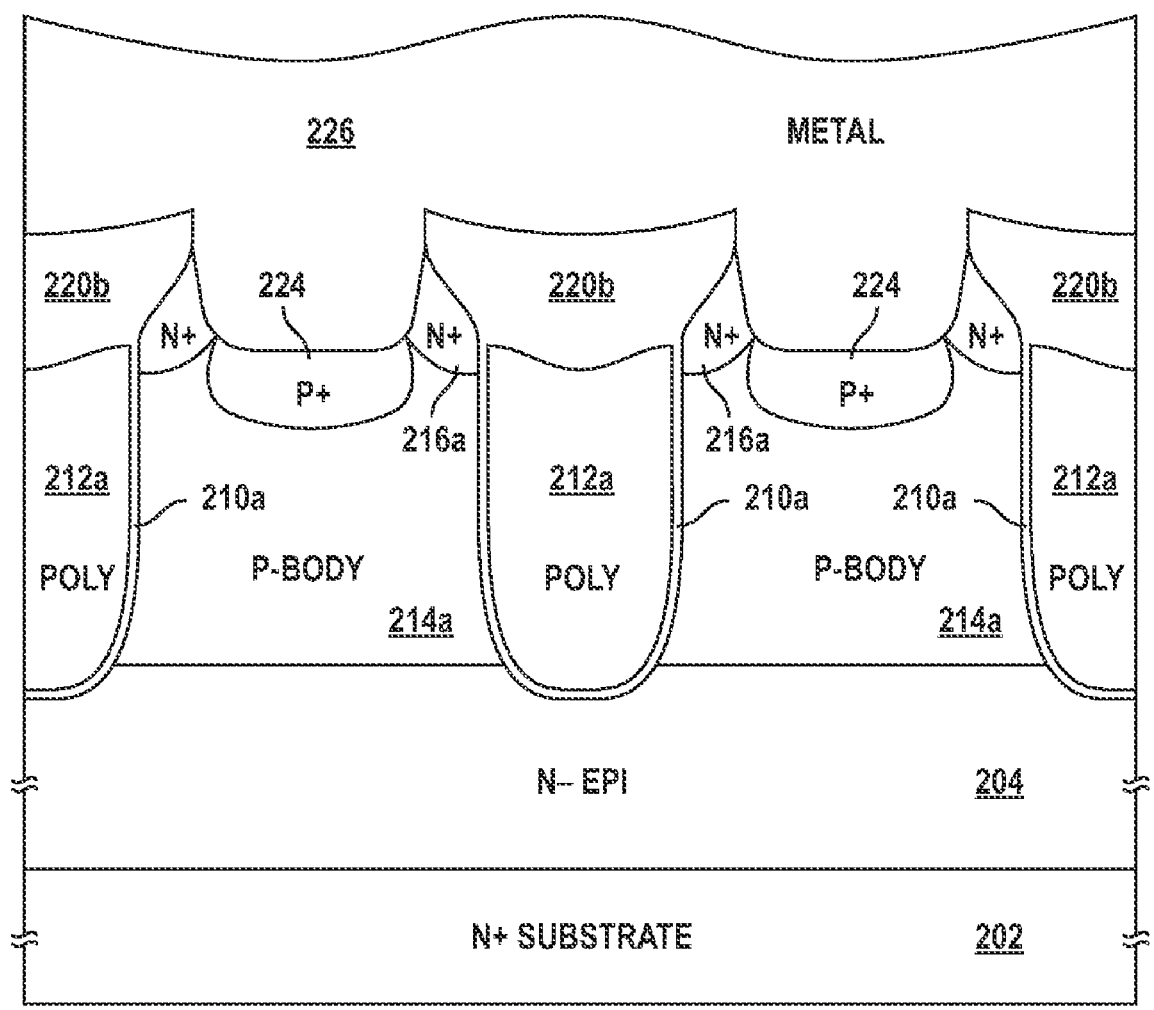
FIG. 5 is an exemplary cross-sectional view corresponding to that in FIG. 4H, and is provided to show a more accurate representation of the contours of the trenches formed in accordance with embodiments of the invention.

The cross-section views in the figures are merely illustrative and are not intended to limit the layout or other structural aspects of the cell array. Furthermore, these figures may not accurately reflect the actual shape of all the various regions as they would appear in an actual device. FIG. 5 is an exemplary cross-section view corresponding to that in FIG. 4H, and is provided to show a more accurate representation of the contours of the trenches in accordance with one embodiment of the invention. Because of the small dimensions of some of the regions and the effects of such processing steps as temperature cycles, a rounding of many of the corners occurs during processing. As a result, the trenches appear Y-shaped as shown in FIG. 5 rather than T-shaped as shown in the earlier figures. However, it is to be understood that the invention is not limited to a particular shape of the trenches.

The process sequence is not necessarily limited to that described above. For example, body region 214 (FIG. 4C) may be formed earlier in the process. For example, in FIG. 2A, prior to forming masking layer 260 and photoresist layer 271, P-type impurities may be implanted into semiconductor region 250 or a P-type epitaxial layer may be grown over semiconductor region 250. Similarly, N-type regions 216 (FIG. 4C) may be formed earlier in the processing sequence. For example, a blanket implant of N-type impurities may be carried out to form a highly-doped N-type region in the body region before forming the trenches. The highly-doped N-type region however needs to extend deeper into the body region than that depicted in FIG. 4C so that after the trenches are formed, at least a portion of the N-type region extends below the outer sections of the trenches. Also, a deeper silicon etch would be required in FIG. 4G in order to reach a surface of the body region.

In a further variation, epitaxial layer 204 may have a graded doping concentration rather than a fixed doping concentration, or may be made of a number of epitaxial layers each having a different doping concentration, or may be eliminated all together depending on the design goals. Moreover, the trenches may extend clear through epitaxial layer 204 and terminate within substrate 202.

Thus, in accordance with embodiments of the invention, stream-lined processes are disclosed for forming trench FETs with self-aligned features that require minimal number of masks, resulting in reduced cell pitch, lower cost, faster manufacturing cycle time and more uniform device characteristics such as threshold voltage Vt and Rdson.

The invention is not limited to any particular types of transistors and may be implemented in a variety of devices. For example, any combinations of the process sequences depicted in FIGS. 2A-2H, 3A-3B and 4A-4H can be used to form: P-channel trench gate MOSFETs (i.e., a transistor similar in structure to that in FIG. 4H except that the conductivity type of all silicon regions is reversed); N-channel trench gate IGBT (i.e., a transistor similar in structure to that in FIG. 4H except that a P-type substrate is used instead of the N-type substrate); P-channel trench gate IGBT (i.e., a transistor similar in structure to that in FIG. 4H but with silicon regions of opposite conductivity except the substrate is kept N-type); N-channel shielded gate trench MOSFET (i.e., a transistor similar in structure to that in FIG. 4H except that a shield electrode is formed under and is insulated from gate electrode 212a); P-channel shielded gate trench MOSFET (i.e., a transistor similar in structure to that in FIG. 4H except that a shield electrode is formed under and is insulated from gate electrode 212a, and the conductivity type of all silicon regions is reversed); N-channel shielded gate trench IGBT (i.e., a transistor similar in structure to that in FIG. 4H except that a shield electrode is formed under and is insulated from gate electrode 212a, and a P-type substrate is used instead of the N-type substrate); P-channel shielded gate trench IGBT (i.e., a transistor similar in structure to that in FIG. 4H except that a shield electrode is formed under and is insulated from gate electrode 212a, and the silicon regions are of opposite conductivity type but for the substrate); trench gate synchFET (i.e., integrated trench gate MOSFET and Schottky); and superjunction variations of the above devices (i.e., devices with columns of alternating conductivity type silicon).

Thus, while the foregoing is directed to some exemplary embodiments, other and further embodiments may be devised without departing from the basic scope thereof, and the scope thereof is determined by the claims that follow.

What is claimed is:

1. A method for forming a semiconductor structure, comprising:
    forming a stack of a hard mask layer and a photoresist layer over a semiconductor region such that the photoresist layer has an opening therein and the hard mask layer has outer portions covered by the photoresist layer and inner portions exposed through the opening in the photoresist layer, the exposed inner portions of the hard mask layer being thinner than the covered outer portions of the hard mask layer, the exposed inner portions of the hard mask layer defining an exposed surface area of the semiconductor region;
    removing a portion of the semiconductor region through the exposed surface area of the semiconductor region;
    removing the thinner portions of the hard mask layer to expose surface areas of the semiconductor region underlying the thinner portions; and
    removing an additional portion of the semiconductor region through all exposed surface areas of the semiconductor region thereby forming a trench having an upper portion that is wider than its lower portion.

2. The method of claim 1 wherein the step of forming a stack further comprises:
    forming a hard mask layer over a semiconductor region;
    forming a patterned photoresist layer over the hard mask layer, the patterned photoresist layer having an opening through which a surface area of the hard mask layer is exposed;
    forming a recess in the hard mask layer through the exposed surface area of the hard mask layer;
    trimming the patterned photoresist layer so as to widen the opening in the patterned photoresist layer thereby exposing additional portions of the hard mask layer; and
    recessing exposed portions of the hard mask layer to form the exposed inner portions of the hard mask layer which define an opening through which the surface area of the semiconductor region is exposed.

3. The method of claim 2 wherein the step of forming a patterned photoresist layer comprises:
    forming a photoresist layer over the semiconductor region; and
    forming an opening in the photoresist layer so as to expose a surface area of the hard mask layer.

4. The method of claim 3 further comprising entirely removing the patterned photoresist layer prior to the step of removing a portion of the semiconductor region.

5. The method of claim 4 wherein the steps of forming an opening in the photoresist layer, forming a recess in the hard mask layer, trimming the patterned photoresist layer, recessing exposed portions of the hard mask layer, and entirely removing the patterned photoresist layer are all carried out in a single processing chamber.

6. The method of claim 2, wherein the steps of forming a recess in the hard mask layer, trimming the patterned photoresist layer, and recessing exposed portions of the hard mask layer are all carried out in a single processing chamber.

7. The method of claim 2, wherein the step of forming a recess in the hard mask layer further comprises determining a depth of the recessed hard mask layer by an interferometric endpoint detection method.

8. The method of claim 2, wherein the steps of recessing exposed portions of the hard mask layer to form exposed step portions of the hard mask layer further comprises determining a height of the exposed step portions by an interferometric endpoint detection method.

9. The method of claim 1, wherein each of the steps of removing a portion of the semiconductor region and removing an additional portion of the semiconductor region are carried out using a selective etch process.

10. The method of claim 1 wherein the semiconductor region is of a first conductivity type, the method further comprising:
    forming a gate dielectric lining sidewalls of the trench;
    forming a gate electrode in the lower portion of the trench;
    forming a body region of the second conductivity type in the semiconductor region; and
    forming source regions of the first conductivity type in the body region adjacent the trench.

11. The method of claim 1 wherein the semiconductor region is of a first conductivity type, the method further comprising:
    forming a shield dielectric lining lower sidewalls and bottom of the lower portion of the trench;
    forming a shield electrode in the lower portion of the trench, the shield electrode being insulated from the silicon region by the shield dielectric;
    forming an inter-electrode dielectric over the shield electrode;
    forming a gate electrode in the lower portion of trench over the inter-electrode dielectric;

forming a well region of the second conductivity type in the silicon region; and forming source regions of the first conductivity type in the well region adjacent each trench.

12. A method for forming a semiconductor structure, comprising:

forming a stack of a hard mask layer and a photoresist layer over a semiconductor region such that the photoresist layer has an opening therein and the hard mask layer has outer portions covered by the photoresist layer and inner portions exposed through the opening in the photoresist layer, the exposed inner portions of the hard mask layer being thinner than the covered outer portions of the hard mask layer, the exposed inner portions of the hard mask layer defining an exposed surface area of the semiconductor region; and using a single etch process, removing: (1) a portion of the semiconductor region through the exposed surface area of the semiconductor region, (2) the thinner portions of the hard mask layer, (3) portions of the semiconductor region underlying the thinner portions, thereby forming a trench having an upper portion that is wider than its lower portion.

13. The method of claim 12 wherein the removing step thins down but does not completely remove the outer portions of the hard mask layer.

14. The method of claim 12 wherein the removing step is carried out using a selective etch process.

15. The method of claim 12 wherein the removing step is carried out using an etch process with an etch selectivity of the semiconductor region to the hard mask layer of about 10 or more.

16. The method of claim 12 wherein the step of forming a stack further comprises:

forming a hard mask layer over a semiconductor region;

forming a patterned photoresist layer over the hard mask layer, the patterned photoresist layer having an opening through which a surface area of the hard mask layer is exposed;

forming a recess in the hard mask layer through the exposed surface area of the hard mask layer;

trimming the patterned photoresist layer so as to widen the opening in the patterned photoresist layer thereby exposing additional portions of the hard mask layer; and recessing exposed portions of the hard mask layer to form the exposed inner portions of the hard mask layer which define an opening through which the surface area of the semiconductor region is exposed.

17. The method of claim 16 wherein the step of forming a patterned photoresist layer comprises:

forming a photoresist layer over the semiconductor region; and forming an opening in the photoresist layer so as to expose a surface area of the hard mask layer.

18. The method of claim 17 further comprising entirely removing the patterned photoresist layer prior to the step of removing a portion of the semiconductor region.

19. The method of claim 18 wherein the steps of forming an opening in the photoresist layer, forming a recess in the hard mask layer, trimming the patterned photoresist layer, recessing exposed portions of the hard mask layer, and entirely removing the patterned photoresist layer are all carried out in a single processing chamber.

20. The method of claim 16, wherein the steps of forming a recess in the hard mask layer, trimming the patterned photoresist layer, and recessing exposed portions of the hard mask layer are all carried out in a single processing chamber.

21. The method of claim 16, wherein the step of forming a recess in the hard mask layer further comprises determining a depth of the recessed hard mask layer by an interferometric endpoint detection method.

22. The method of claim 16, wherein the steps of recessing exposed portions of the hard mask layer to form exposed step portions of the hard mask layer further comprises determining a height of the exposed step portions by an interferometric endpoint detection method.

23. The method of claim 12 wherein the semiconductor region is of a first conductivity type, the method further comprising:

forming a gate dielectric lining sidewalls of the trench;

forming a gate electrode in the lower portion of the trench;

forming a body region of the second conductivity type in the semiconductor region; and forming source regions of the first conductivity type in the body region adjacent the trench.

24. The method of claim 12 wherein the semiconductor region is of a first conductivity type, the method further comprising:

forming a shield dielectric lining lower sidewalls and bottom of the lower portion of the trench;

forming a shield electrode in the lower portion of the trench, the shield electrode being insulated from the silicon region by the shield dielectric;

forming an inter-electrode dielectric over the shield electrode;

forming a gate electrode in the lower portion of trench over the inter-electrode dielectric;

forming a well region of the second conductivity type in the silicon region; and forming source regions of the first conductivity type in the well region adjacent each trench.

* * * * *